(12) United States Patent
Contopanagos et al.

(10) Patent No.: US 6,812,544 B2
(45) Date of Patent: Nov. 2, 2004

(54) INTEGRATED CIRCUIT HAVING OVERSIZED COMPONENTS

(75) Inventors: Harry Contopanagos, Santa Monica, CA (US); Christos Komninakis, Los Angeles, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/395,430

(22) Filed: Mar. 24, 2003

(65) Prior Publication Data

US 2004/0038470 A1 Feb. 26, 2004

Related U.S. Application Data

(62) Division of application No. 10/074,515, filed on Feb. 12, 2002, now Pat. No. 6,709,977.

(51) Int. Cl.[7] .............................................. H01L 29/00
(52) U.S. Cl. ....................... 257/531; 257/499; 257/506; 257/516; 257/528; 438/421; 438/624; 438/631; 438/633; 438/689; 438/692

(58) Field of Search ................................. 257/499, 531

(56) References Cited

U.S. PATENT DOCUMENTS 5,686,356 A * 11/1997 Jain et al. .................. 438/624

* cited by examiner

*Primary Examiner*—David Nelms
*Assistant Examiner*—Andy Huynh
(74) *Attorney, Agent, or Firm*—Timothy W. Markison

(57) ABSTRACT

An integrated circuit includes electrical components that include one or more electrical elements on one or more dielectric layers. The electrical element has a geometric shape that exceeds prescribed integrated circuit manufacturing limits in at least one dimension. To achieve compliance with foundry rules, the electrical element is fabricated to include a non-conducting region that negligibly effects the electrical characteristics. The non-conducting region includes a hole, a series of holes, a slot and/or a series of slots spaced within the electrical element at dimensions that are less than the integrated circuit manufacturing limits.

11 Claims, 5 Drawing Sheets

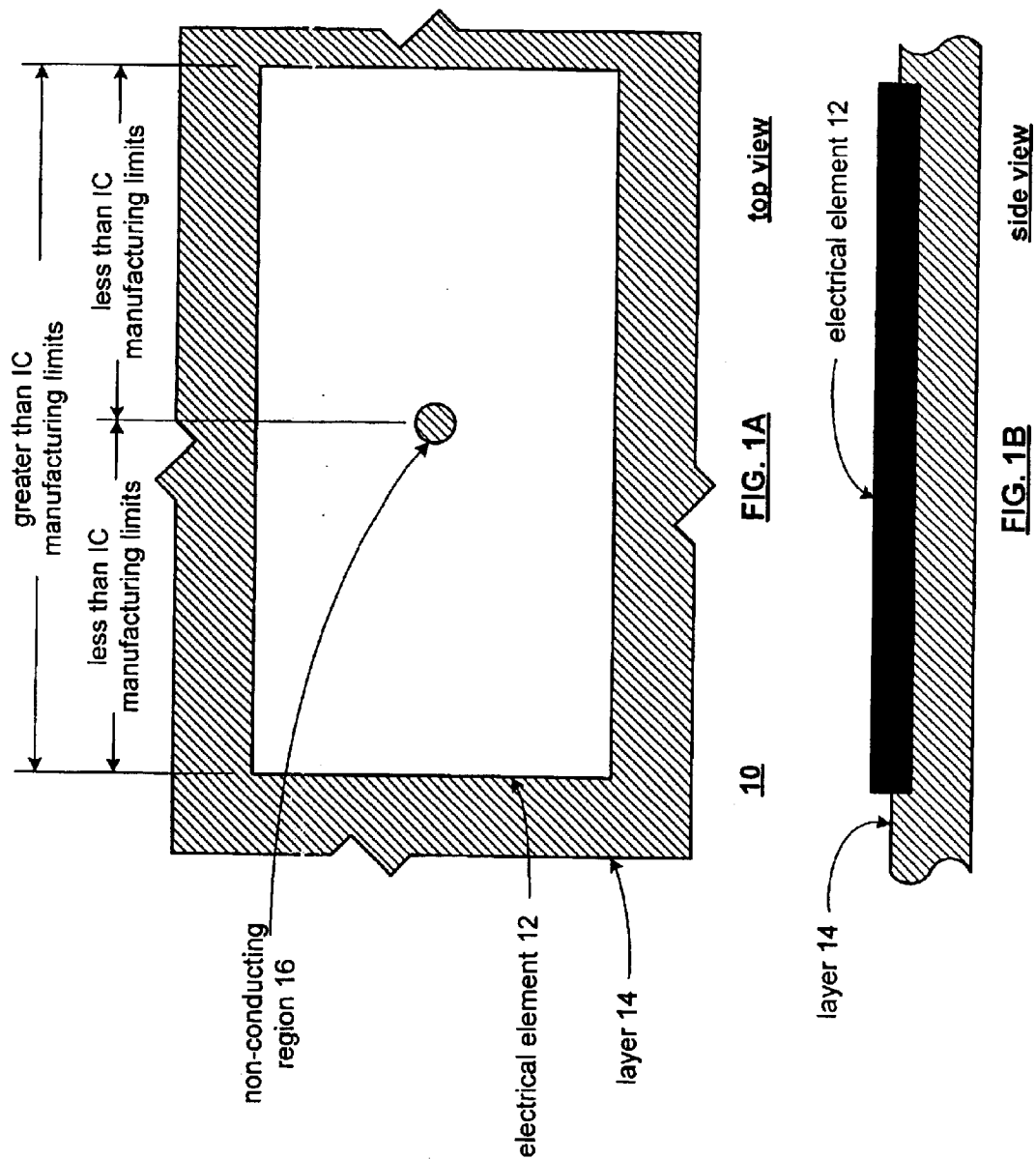
FIG. 1A top view
FIG. 1B side view

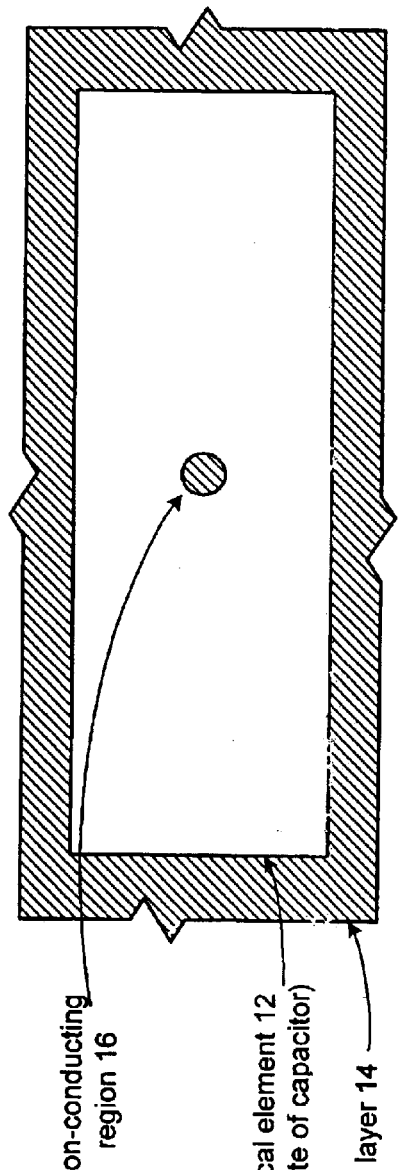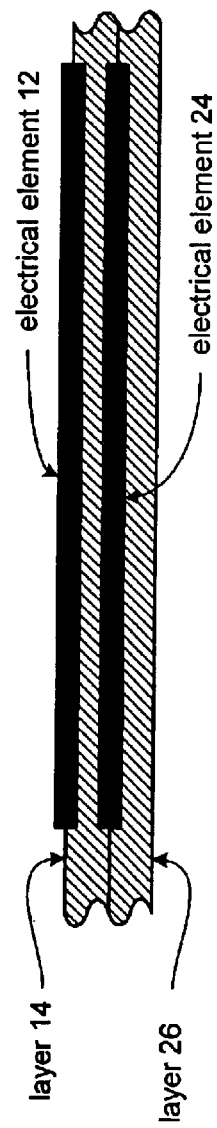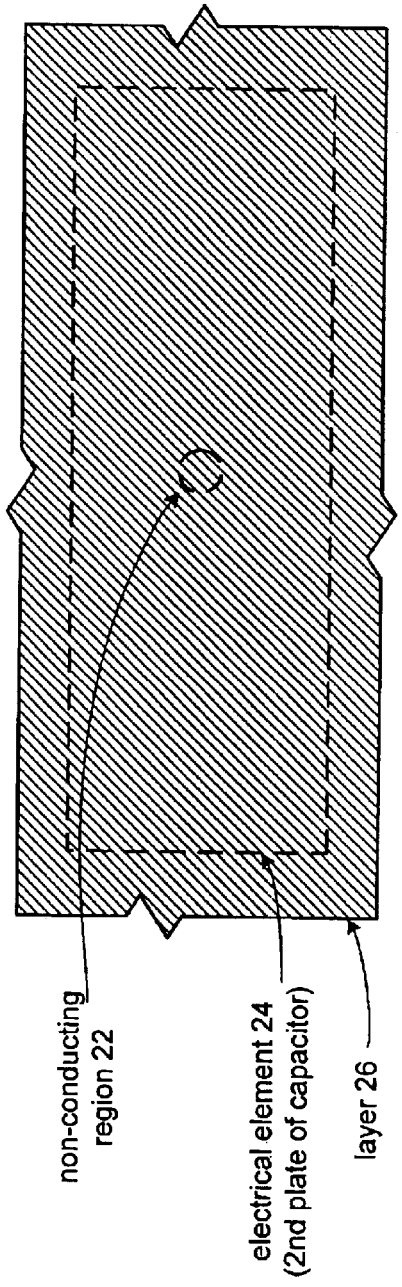

INTEGRATED CIRCUIT HAVING OVERSIZED COMPONENTS

This patent application is a divisional claiming priority under 35 USC § 121 to pending patent application entitled ON-CHIP INDUCTOR HAVING IMPROVED QUALITY FACTOR AND METHOD OF MANUFACTURE THEREOF, having a Ser. No. 10/074,515, and a filing date of Feb. 12, 2002 now U.S. Pat. No. 6,709,977.

TECHNICAL FIELD OF THE INVENTION

This invention relates generally to integrated circuits and more particularly to components that comprise an integrated circuit.

BACKGROUND OF THE INVENTION

The general structure of an integrated circuit is known to include one or more dielectric layers on a substrate. As is further known, each of the dielectric layers supports a metal layer, which is etched or deposited to form integrated circuit components such as resistors, capacitors, inductors, transistors, conductive traces, et cetera. The number of dielectric layers, and hence the number of metal layers, along with acceptable physical dimensions of the dielectric layers and metal layers are dictated by the particular type of integrated circuit technology and the corresponding integrated circuit fabrication rules. For example, a CMOS integrated circuit may include multiple dielectric layers and multiple corresponding metal layers. Depending on the particular foundry rules, the size of each dielectric layer and corresponding metal layers have prescribed minimum and maximum dimensions. In addition, such foundry rules prescribe maximum dimensions for metal tracks formed on the metal layers. For instance, the maximum metal track may be 30–40 microns for a given CMOS process. As is known, IC foundries provide the maximum metal track dimensions to prevent over-stressing the integrated circuit and/or to ensure reliability of fabrication.

As is also known, integrated circuit foundries provide minimum spacing between metal tracks. For example, the minimum spacing may be 1.0 microns to 3.0 microns and may further be dependent on the particular metal layer the track is on and/or the width of adjacent tracks.

Such foundry rules limit the ability to design certain on-chip components. For instance, on-chip inductors designed using CMOS technologies are limited to a quality factor (i.e., Q factor which=2(pi)fL/R, where R=the effective series resistance, L=the inductance and f is the operating frequency) of about 5 to 8 at frequencies of 2.5 gigahertz. Such a low quality factor is primarily due to a significant effective series resistance at 2.5 gigahertz. As is further known, the effective series resistance is dependent on the operating frequency of the component and is further dependent on the size of the metal track. As such, by limiting the size of metal tracks, the quality factor of inductors is limited to low values.

Capacitance values of on-chip metal insulated metal capacitors are also limited due to the foundry rules. As is known, the capacitance of a capacitor is based on the area of its plates, the distance between the plates, and the dielectric properties of the dielectric material separating the plates. Since the foundry rules limit the size of the plates, the capacitor values are limited, which, in turn, limit the uses of on-chip capacitors.

Therefore, a need exists for a technique to increase the effective size of metal tracks while maintaining compliance with foundry metal track rules and to allow for greater range of design of on-chip integrated circuit components.

SUMMARY OF THE INVENTION

These needs and others are substantially met by the integrated circuit described herein. Such an integrated circuit includes electrical components that include one or more electrical elements on one or more dielectric layers. The electrical element, which may be a winding(s) of an inductor, power source trace, gate of a transistor, source of a transistor, drain of a transistor, plate of a capacitor, resistor, electromagnetic shield, ground plane et cetera, has a geometric shape that exceeds prescribed integrated circuit manufacturing limits. For example, if the integrated circuit manufacturing limits prescribe metal tracks not to exceed 35 microns in width or length, the electrical element of the present invention has a dimension in width and length that exceeds 35 microns. To achieve compliance with foundry rules, the electrical element is fabricated to include a non-conducting region that negligibly effects the electrical characteristics. For instance, the electrical element may be fabricated to include a hole, a series of holes, a slot and/or a series of slots spaced within the electrical element at dimensions that are less than the integrated circuit manufacturing limits.

BRIEF DESCRIPTION OF THE DRAWINGS

FIGS. 1A and 1B illustrate a top and side view of an electrical element in accordance with the present invention;

FIGS. 6A, B and C illustrate top, side, and bottom views of a capacitor in accordance with the present invention.

DETAIL DESCRIPTION OF A PREFERRED EMBODIMENT

Figure 3:
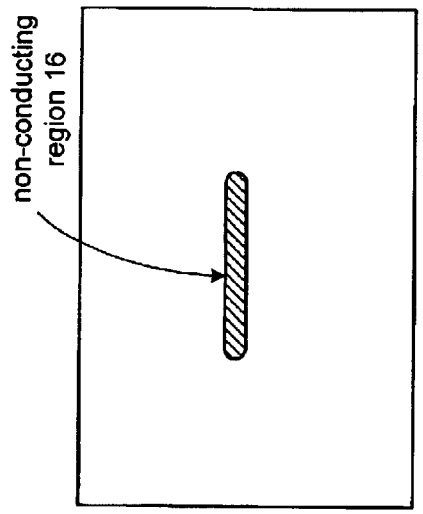
FIG. 3 illustrates a graphical representation of an alternate non-conducting region of an electrical element in accordance with the present invention.

FIGS. 1A and B illustrate top and side view of an integrated circuit 10 that includes an electrical element 12 created on a dielectric layer 14. The electrical element 12 may be used as at least one turn of an inductor, as one plate of a capacitor, as an electromagnetic shield, as a ground plane, as a power source trace, as a gate of a transistor, a source of a transistor, a drain of a transistor, or as an antenna.

The electrical element 12 includes a non-conducting region 16. As shown, the electrical element 12 has a dimension from end-to-end that is greater than integrated circuit (IC) manufacturing limits. The non-conducting region 16, which may be a single hole, is spaced at dimensions that are less than IC manufacturing limits. For instance, if the manufacturing limits for a CMOS process is 35 microns, the overall dimension of electrical element 12 exceeds the 35 microns. For instance, the width of the electrical element may be at least 50 microns when the electrical element 12 is used for an inductor. To provide compliance with IC manufacturing limits, the non-conducting region 16, which may be a hole having a dimension that corresponds to minimum spacing distances for the IC foundry rules, is included within the electrical element 12 such that the IC manufacturing limits are met. For instance, if the foundry rules provide that 1–3 microns are needed for spacing between metal tracks, the non-conducting region would have a diameter of 1–3 microns. In the example of an inductor, if the width of the electrical element 12 is 50 microns, by placing the non-conducting region in the middle, (i.e., at 25 microns) with respect to each end of the electrical element, the IC manufacturing limits of 35 microns for metal tracks are substantially met.

By providing the non-conducting region 12 within an electrical element 12 that exceeds IC manufacturing limits, components, such as inductors, capacitors, resistors, ground planes, electromagnetic shields, power source traces, transistors, and/or antennas may be fabricated on-chip in sizes and/or having electrical characteristics that were previously unobtainable. For instance, an on-chip CMOS inductor may be derived that has a quality factor of 12 or more utilizing the concepts generally depicted in FIG. 1.

Figure 4:
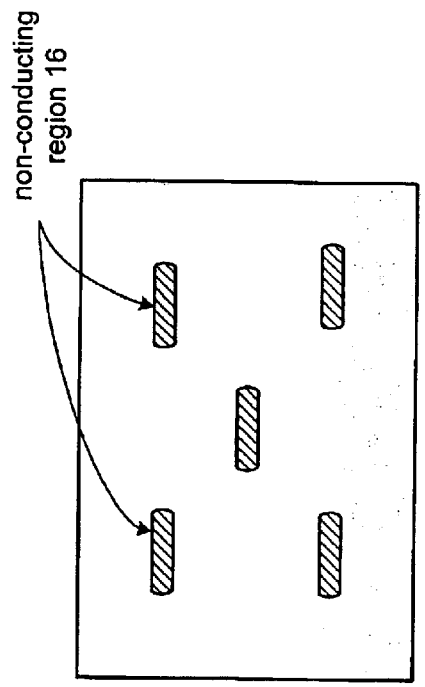
FIG. 4 illustrates a graphical represntation of yet another non-conducting region of an electrical element in accordance with the present invention.
Figure 2:
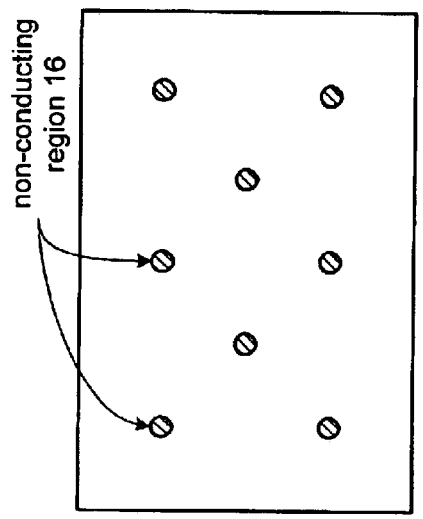
FIG. 2 illustrates a graphical representation of a non-conducting region of an electrical element in accordance with the present invention.

FIGS. 2 through 4 illustrate alternate embodiments for fabricating the non-conducting region 16. FIG. 2 illustrates the electrical element 12 that includes a plurality of holes spaced to provide the non-conducting region 16. In this embodiment, the electrical element 12 has a height and width that both exceed the IC manufacturing limits (e.g., 35 microns for metal tracks). As such, the series of holes are spaced at dimensions less than the IC manufacturing limits and have a diameter that equals, or slightly exceeds the prescribed spacing requirements between metal tracks for a particular foundry rule.

FIG. 3 illustrates the electrical element 12 that includes a slit for the non-conducting region 16. The length of the slit is dependent on the width of the electrical element 12. The width of the non-conducting region 16 corresponds to the prescribed foundry rules regarding spacing between metal tracks. Accordingly, the slit may be fabricated to have varying widths depending on the width of the electrical element 12.

FIG. 4 illustrates the electrical element 12 that includes the non-conducting region 16, which includes a plurality of slits. In this embodiment, the electrical element 12 substantially exceeds the IC manufacturing limits regarding metal track dimensions in both height and width. By spacing the slits at dimensions that are less than the IC manufacturing limits, the IC manufacturing limits are substantially met. As such, the electrical elements 12 as depicted in FIGS. 1 through 4, are compliant with IC manufacturing foundry rules yet provide substantially larger conductive areas and where the size of the non-conducting region 16 has negligible effects on the electrical characteristics of the electrical element 12.

Figure 5:
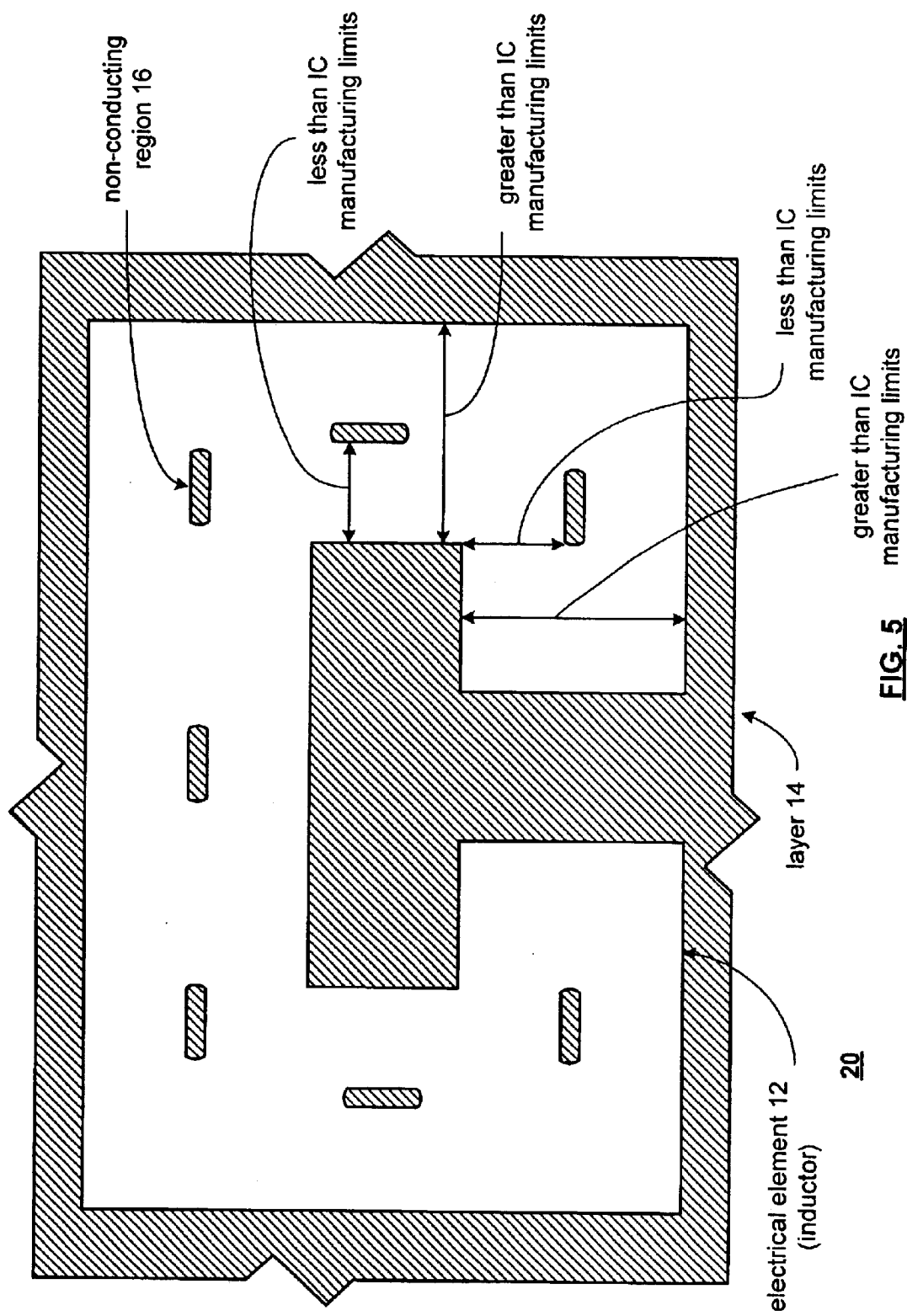
FIG. 5 illustrates a graphical representation of an on-chip inductor in accordance with the present invention.

FIG. 5 illustrates an on-chip inductor 20 that includes the electrical element 12 fabricated as at least one turn of the on-chip inductor 20. The electrical element 12 has a width that exceeds the IC manufacturing limits but has a plurality of non-conducting regions, which are depicted as slots, spaced within the electrical element at dimensions that are less than the IC manufacturing limits. For instance, the width of the electrical element may be approximately 50 microns yielding a quality factor of 12 at approximately 2.4 gigahertz. The width of the slots comprising the non-conducting region may be approximately 1 micron wide and positioned at dimensions less than 35 microns. In both simulations and testing, the results with and without the slits provided essentially the same quality factor for both 0.18 micron (e.g., approximately 12) and 0.35 micron CMOS technologies. Since the non-conducting regions are relatively small, they do not perturb the electromagnetic properties of the inductor.

FIGS. 6A, B and C illustrate a top, side, and bottom view of an on-chip capacitor. In this embodiment, the electrical element 12 forms a $1^{st}$ plate of the on-chip capacitor and is created on dielectric layer 14. The electrical element 12 includes a non-conducting region 16, which may be implemented as depicted in FIGS. 1 through 4. The $2^{nd}$ plate of the on-chip capacitor is provided by electrical element 24, which is created on dielectric layer 26. The electrical element 24 includes a non-conducting region 22, which may be implemented as depicted in FIGS. 1 through 4. In this configuration, a very large parallel plate capacitor or metal insulator metal (MIM) capacitor may be obtained. For instance, the dimensions of the plates may be 400 micron by 400 micron or higher, wherein the non-conducting region includes a plurality of holes having a radius of approximately 1 micron and spaced approximately 35 microns apart in both the X and Y directions.

As one of average skill in the art will appreciate, a $3^{rd}$ plate of a capacitor may be fabricated on a $3^{rd}$ dielectric layer and coupled to the electrical element 12 to produce a sandwich capacitor.

Figure 7:
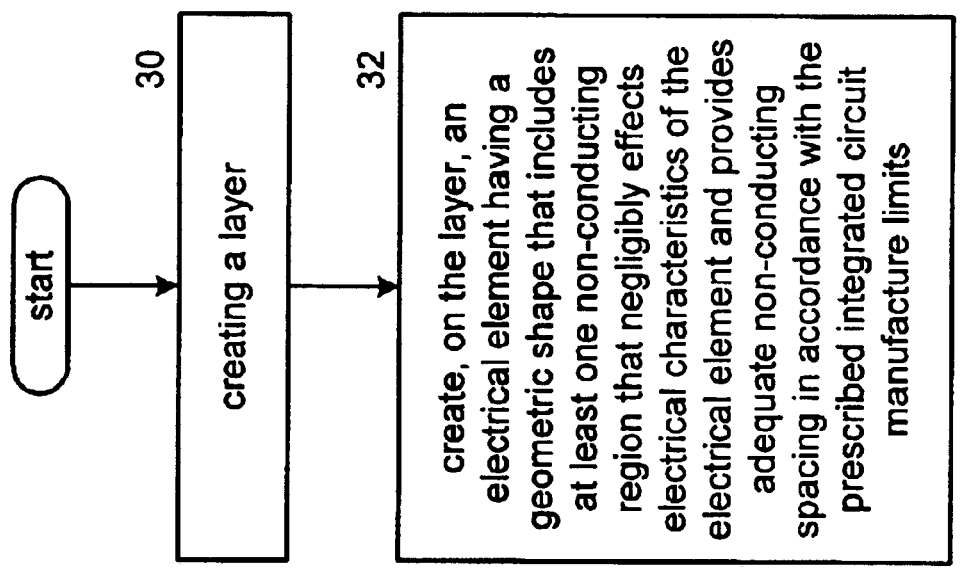
FIG. 7 illustrates a logic diagram of a method for manufacturing an integrated circuit in accordance with the present invention.

FIG. 7 illustrates a logic diagram of a method for fabricating an integrated circuit in accordance with the present invention. The process begins at Step 30 where one or more dielectric layers are created. The process then proceeds to Step 32 where an electrical element having a geometric shape that includes at least one non-conducting region is fabricated on one or more of the dielectric layers. The non-conducting region has negligible effects on the electrical characteristics of the electrical element and provides adequate non-conducting spacing in accordance with prescribed integrated circuit manufacturing limits. The electrical element has at least one dimension that exceeds the prescribed integrated circuit manufacturing limits. This was generally depicted in FIGS. 1 through 4 with specific embodiments illustrated in FIGS. 5 and 6. Accordingly, the electrical element may be used as one or more windings of an inductor, a plate of a capacitor, an electromagnetic shield, a ground plane, a power source trace, a gate of a transistor, a source of a transistor and/or a drain of a transistor, or an antenna.

The preceding discussion has presented an integrated circuit that includes on-chip components that have electrical elements that exceed integrated circuit manufacturing limits. By including the non-conductive regions within electrical elements of such on-chip components, IC manufacturing limits may be adhered to while providing the benefits of oversized electrical elements. As one of average skill in the art will appreciate, other embodiments may be derived from the teachings of the present invention, without deviating from the scope of the claims.

What is claimed is:

1. An integrated circuit comprises:

a layer; and an electrical element on the layer, wherein the electrical element has a geometric shape that exceeds prescribed integrated circuit manufacture limits, wherein the electrical element includes at least one non-conducting region that negligibly effects electrical characteristics of the electrical element and provides adequate non-conducting spacing in accordance with the prescribed integrated circuit manufacture limits.

2. The integrated circuit of claim 1, wherein the non-conducting region further comprises at least one of: a slit within the electrical element, a series of slits within the electrical element, a hole within the electrical element, and a series of holes within the electrical element.

3. The integrated circuit of claim 1, wherein the electrical element constitutes at least one turn of an inductor.

4. The integrated circuit of claim 3 further comprises:

a second layer;

a second electrical element on the second layer, wherein the second electrical element has a second geometric shape that exceeds the prescribed integrated circuit manufacture limits, wherein the second electrical element includes at least one non-conducting second region, wherein the second electrical element constitutes at least one other turn of the inductor, and wherein the at least one turn is connected to the at one other turn in parallel or in series.

5. The integrated circuit of claim 1 further comprises:

the electrical element functioning as a plate of a capacitor;

a dielectric layer, wherein a first major surface of the dielectric layer is juxtaposed to a major surface of the plate; and a second electrical element that functions as a second plate of the capacitor, wherein the second electrical element has a geometric shape that exceeds the prescribed integrated circuit manufacture limits, wherein a major surface of the second plate is juxtaposed to a second major surface of the dielectric layer, and wherein the second electrical element includes at least one non-conductive region that negligibly effects electrical characteristics of the capacitor and provides adequate non-conducting spacing in accordance with the prescribed integrated circuit manufacture limits.

6. The integrated circuit of claim 5 further comprises:

a second dielectric layer, wherein a first major surface of the second dielectric layer is juxtaposed to a second major surface of the second plate;

a third electrical element that functions as a third plate of the capacitor, wherein the third electrical element has a geometric shape that exceeds the prescribed integrated circuit manufacture limits, wherein a major surface of the third plate is juxtaposed to a second major surface of the second dielectric layer, wherein the third electrical element includes at least one non-conductive region that negligibly effects electrical characteristics of the capacitor and provides adequate non-conducting spacing in accordance with the prescribed integrated circuit manufacture limits, and wherein the electrical element is connected to the third electrical element.

7. The integrated circuit of claim 1, wherein the electrical element constitutes an electromagnetic shield.

8. The integrated circuit of claim 1, wherein the electrical element constitutes a ground plane.

9. The integrated circuit of claim 1, wherein the electrical element constitutes a power source trace.

10. The integrated circuit of claim 1, wherein the electrical element constitutes at least one of: a gate of a transistor, a source of the transistor, and a drain of the transistor.

11. The integrated circuit of claim 1, wherein the electrical element constitutes an antenna.

* * * * *